(12) United States Patent
Sawabe et al.

(10) Patent No.: US 8,040,520 B2
(45) Date of Patent: Oct. 18, 2011

(54) DEVICE FOR DETECTING THE EDGES OF A WORKPIECE, AND A LASER BEAM PROCESSING MACHINE

(75) Inventors: Taiki Sawabe, Tokyo (JP); Keiji Nomaru, Tokyo (JP)

(73) Assignee: Disco Corporation, Tokyo (JP)

( * ) Notice: Subject to any disclaimer, the term of this patent is extended or adjusted under 35 U.S.C. 154(b) by 267 days.

(21) Appl. No.: 12/314,081

(22) Filed: Dec. 3, 2008

(65) Prior Publication Data

US 2009/0153868 A1 Jun. 18, 2009

(30) Foreign Application Priority Data

Dec. 18, 2007 (JP) ................................ 2007-325742

(51) Int. Cl.
*G01N 21/55* (2006.01)
(52) U.S. Cl. ........................................ 356/445; 356/622
(58) Field of Classification Search ............... 356/237.1, 356/600, 602, 625, 445, 614–624, 448; 250/548, 250/442.11, 492.2, 202; 414/935–941, 757, 414/222.01–222.02
See application file for complete search history.

(56) References Cited

U.S. PATENT DOCUMENTS

| | | | | |
|---|---|---|---|---|
| 4,639,604 A * | 1/1987 | Murakami et al. | ............ | 250/548 |
| 5,432,330 A * | 7/1995 | Nakamura | ................ | 250/201.4 |
| 5,982,491 A * | 11/1999 | Breyer et al. | ................ | 356/614 |
| 6,257,224 B1 | 7/2001 | Yoshino | | |
| 6,323,954 B1 * | 11/2001 | Halter | ............................ | 356/624 |
| 6,549,290 B2 * | 4/2003 | Miura et al. | .................. | 356/614 |
| 6,737,665 B1 * | 5/2004 | Kinrot et al. | ............. | 250/559.36 |
| 2007/0045566 A1 * | 3/2007 | McGinley et al. | .......... | 250/491.1 |
| 2007/0243696 A1 * | 10/2007 | Kobayashi et al. | ............ | 438/463 |

FOREIGN PATENT DOCUMENTS

JP 10305420 A 11/1998

* cited by examiner

*Primary Examiner* — Tarifur Chowdhury
*Assistant Examiner* — Michael P LaPage
(74) *Attorney, Agent, or Firm* — Smith, Gambrell & Russell, LLP

(57) ABSTRACT

A device for detecting the edges of a workpiece held on the chuck table of a processing machine, having a beam oscillation means for oscillating a detection beam, an objective lens for focusing the detection beam oscillated from the beam oscillation means, and a reflected light detection means for detecting the reflected light of the detection beam applied through the objective lens, wherein the beam oscillation means oscillates the detection beam in such a manner that the optical axis of the detection beam becomes parallel to the center axis of the objective lens at a position offset from the center axis; and the reflected light detection means detects the edge of the workpiece based on a positional difference between reflected light obtained when the detection beam applied through the objective lens is reflected on an area where the workpiece is not existent and refracted by the objective lens and reflected light obtained when the detection beam is reflected on the workpiece and refracted by the objective lens.

4 Claims, 9 Drawing Sheets

(a)

(b)

(a)

(b)

(a)

(b)

(c)

(a)

(b)

(c)

DEVICE FOR DETECTING THE EDGES OF A WORKPIECE, AND A LASER BEAM PROCESSING MACHINE

FIELD OF THE INVENTION

The present invention relates to a device for detecting the edges which are the processing start point and processing end point of a workpiece held on the chuck table of a processing machine and to a laser beam processing machine equipped with this edge detection device.

DESCRIPTION OF THE PRIOR ART

An optical device wafer having a plurality of areas sectioned by dividing lines called "streets" which are formed in a lattice pattern on the front surface of a sapphire substrate, and optical devices such as gallium nitride-based compound semiconductors laminated in these sectioned areas is divided along the streets into individual optical devices such as light emitting diodes which are widely used in electric equipment.

Cutting such an optical device wafer along the streets is generally carried out with a cutting machine for cutting by rotating a cutting blade at a high speed. However, since the sapphire substrate has such high Mohs hardness that it is hard to cut, the processing speed must be made low, thereby reducing productivity.

To divide the optical device wafer along the streets, JP-A 10-305420 discloses a method in which grooves are formed by applying a pulse laser beam of a wavelength having absorptivity for the wafer along the street and then, exerting external force along the resulting grooves to divide the wafer.

To carry out laser processing along the streets formed on the wafer, it is necessary to detect the edges which are the processing start point and processing end point of the wafer and apply a laser beam only to an area where the wafer is existent. The detection of the edges which are the processing start point and processing end point of the wafer is judged by applying a detection beam to a chuck table holding the wafer and detecting the reflected light of the detection beam.

When a workpiece such as a wafer is made of a transparent material such as sapphire, the detection beam passes through the workpiece and the edges of the workpiece cannot be detected with certainty. However, even in the case of a workpiece made of a transparent material, the edges of the workpiece can be detected by applying the detection beam to the front surface of the workpiece at an angle and capturing a specular reflection light of the detection beam. To apply the detection beam to the front surfaces of the workpiece at an angle, however, a beam oscillation means for oscillating the detection beam and a light receiving means for receiving the reflected light of the detection beam must be arranged at an angle. Therefore, there is a problem in that the whole detection device becomes bulky and is difficult to install on a laser beam processing machine.

SUMMARY OF THE INVENTION

It is an object of the present invention to provide a device for detecting the edges of a workpiece, which can be made compact, and a laser beam processing machine equipped with the above edge detection device.

To attain the above object, according to the present invention, there is provided a device for detecting the edges of a workpiece held on the chuck table of a processing machine, having a beam oscillation means for oscillating a detection beam, an objective lens for focusing the detection beam oscillated from the beam oscillation means, and a reflected light detection means for detecting the reflected light of the detection beam applied through the objective lens, wherein the beam oscillation means oscillates the detection beam in such a manner that the optical axis of the detection beam becomes parallel to the center axis of the objective lens at a position offset from the center axis; and the reflected light detection means detects the edge of the workpiece based on a positional difference between reflected light obtained when the detection beam oscillated from the beam oscillation means and applied through the objective lens is reflected on an area where the workpiece is not existent and refracted by the objective lens and reflected light obtained when the detection beam is reflected on the workpiece and refracted by the objective lens.

The above reflected light detection means comprises a position detector for receiving reflected light which is reflected on the area where the workpiece is not existent and refracted by the objective lens and reflected light which is reflected on the workpiece and refracted by the objective lens.

The above reflected light detection means comprises a mask member for blocking off reflected light which is reflected on the area where the workpiece is not existent and refracted by the objective lens and a photosensor for receiving reflected light which is reflected on the workpiece and refracted by the objective lens.

According to the present invention, there is also provided a laser beam processing machine comprising a chuck table for holding a workpiece, a laser beam application means comprising a condenser for applying a laser beam to the workpiece held on the chuck table, and a processing-feed means for moving the chuck table and the laser beam application means relative to each other, wherein the laser beam processing machine further comprises a device for detecting the edges of the workpiece, arranged adjacent to the condenser in the processing-feed direction;

the device for detecting the edges of the workpiece having a beam oscillation means for oscillating a detection beam, an objective lens for focusing the detection beam oscillated from the beam oscillation means, and a reflected light detection means for detecting the reflected light of the detection beam applied through the objective lens;

the beam oscillation means oscillates the detection beam in such a manner that the optical axis of the detection beam becomes parallel to the center axis of the objective lens at a position offset from the center axis; and the reflected light detection means detects the edge of the workpiece based on a positional difference between reflected light obtained when the detection beam oscillated from the beam oscillation means and applied through the objective lens is reflected on an area where the workpiece is not existent and refracted by the objective lens and reflected light obtained when the detection beam is reflected on the workpiece and refracted by the objective lens.

Preferably, the above device for detecting the edges of the workpiece is arranged on both sides in the processing-feed direction of the condenser.

The device for detecting the edges of the workpiece according to the present invention has the following constitution, that is, the beam oscillation means for oscillating the detection beam oscillates the detection beam in such a manner that the optical axis of the detection beam becomes parallel to the center axis of the objective lens at a position offset from the center axis, and the reflected light detection means for detecting the reflected light of the detection beam applied through the objective lens detects the edge of the workpiece based on a positional difference between reflected light which is reflected on the area where the workpiece is not existent and refracted by the objective lens and reflected light which is reflected on the workpiece and refracted by the objective lens. Therefore, the whole configuration of the device can have a compact constitution as compared with a constitution which oscillates a detection beam at an angle. In addition, since the detection beam oscillated from the beam oscillation means is refracted by the objective lens and applied to the top surface of the workpiece at an angle, even when the workpiece is a transparent member, specular reflection light can be captured.

DETAILED DESCRIPTION OF THE PREFERRED EMBODIMENTS

A device for detecting the edges of a workpiece and a laser beam processing machine-constituted according to preferred embodiments of the present invention will be described in more detail hereinunder with reference to the accompanying drawings.

Figure 1:
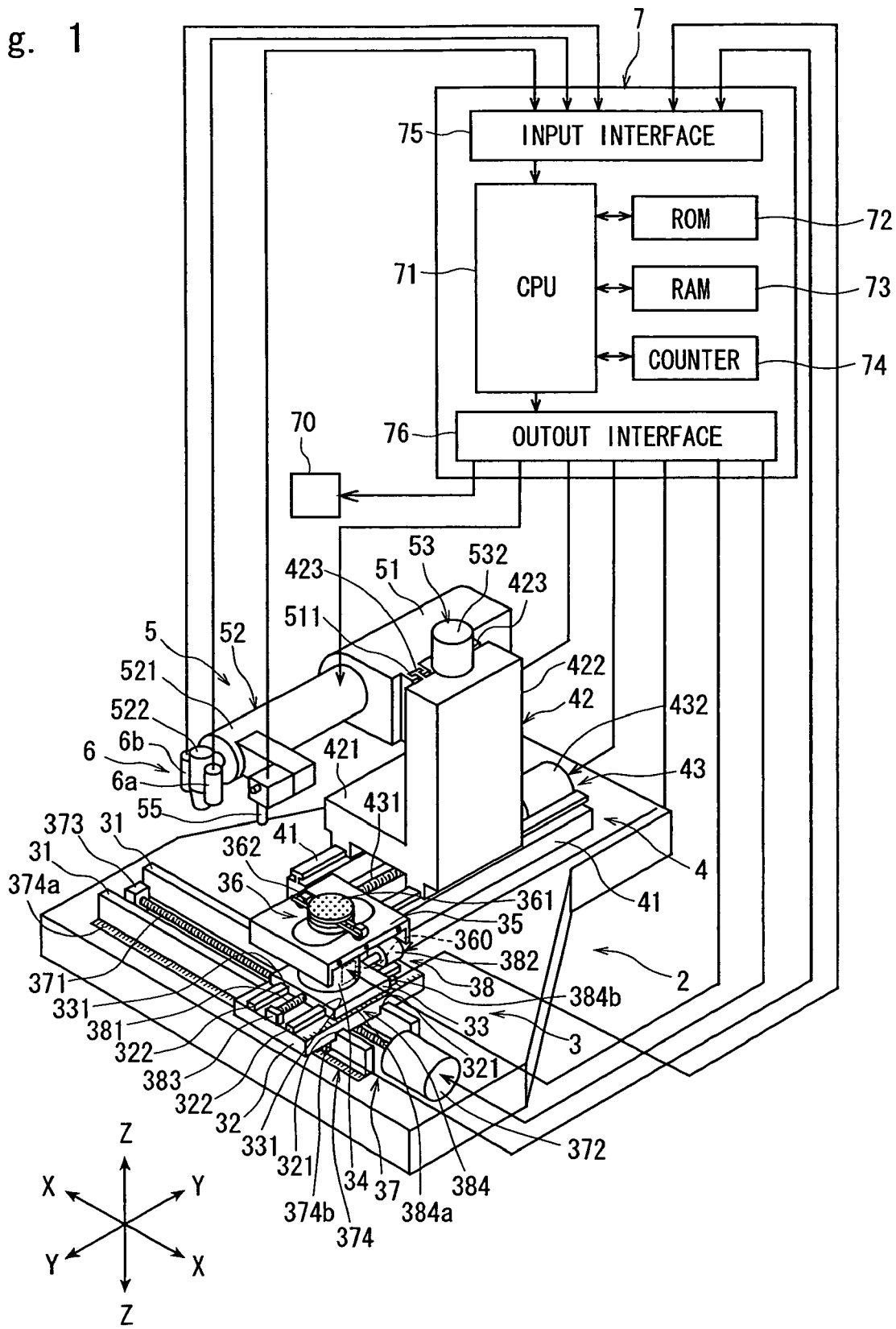
FIG. 1 is a perspective view of a laser beam processing machine equipped with a device for detecting the edges of a workpiece constituted according to the present invention.

FIG. 1 is a perspective view of the laser beam processing machine equipped with the device for detecting the edges of a workpiece constituted according to the present invention. The laser beam processing machine shown in FIG. 1 comprises a stationary base 2, a chuck table mechanism 3 for holding a workpiece, which is mounted on the stationary base 2 in such a manner that it can move in a processing-feed direction (X direction) indicated by an arrow X, a laser beam application unit support mechanism 4 mounted on the stationary base 2 in such a manner that it can move in an indexing-feed direction (Y direction) indicated by an arrow Y perpendicular to the direction indicated by the arrow X, and a laser beam application unit 5 mounted to the laser beam application unit support mechanism 4 in such a manner that it can move in a direction (Z direction) indicated by an arrow Z.

The above chuck table mechanism 3 comprises a pair of guide rails 31 and 31 mounted on the stationary base 2 and arranged parallel to each other in the processing-feed direction (X direction) indicated by the arrow X, a first sliding block 32 mounted on the guide rails 31 and 31 in such a manner that it can move in the processing-feed direction (X direction) indicated by the arrow X, a second sliding block 33 mounted on the first sliding block 32 in such a manner that it can move in the indexing-feed direction (Y direction) indicated by the arrow Y, a cover table 35 supported on the second sliding block 33 by a cylindrical member 34, and a chuck table 36 as a workpiece holding means. This chuck table 36 has an adsorption chuck 361 made of a porous material so that a disk-like semiconductor wafer as the workpiece is held on the top surface (holding surface) of the adsorption chuck 361 by a suction means that is not shown. The chuck table 36 constituted as described above is rotated by a pulse motor installed in the cylindrical member 34. The chuck table 36 is provided with clamps 362 for fixing an annular frame which will be later described.

The above first sliding block 32 has, on its undersurface, a pair of to-be-guided grooves 321 and 321 to be fitted to the above pair of guide rails 31 and 31 and, on its top surface, a pair of guide rails 322 and 322 formed parallel to each other in the indexing-feed direction (Y direction) indicated by the arrow Y. The first sliding block 32 constituted as described above is constituted to be moved in the processing-feed direction (X direction) indicated by the arrow X along the pair of to-be-guided rails 31 and 31 by fitting the guide grooves 321 and 321 to the pair of guide rails 31 and 31, respectively. The chuck table mechanism 3 in the illustrated embodiment has a processing-feed means 37 for moving the first sliding block 32 in the processing-feed direction (X direction) indicated by the arrow X along the pair of guide rails 31 and 31. The processing-feed means 37 comprises a male screw rod 371 which is arranged between the above pair of guide rails 31 and 31 parallel to them and a drive source such as a pulse motor 372 for rotary-driving the male screw rod 371. The male screw rod 371 is, at its one end, rotatably supported to a bearing block 373 fixed on the above stationary base 2 and is, at the other end, transmission-coupled to the output shaft of the above pulse motor 372. The male screw rod 371 is screwed into a threaded through-hole formed in a female screw block (not shown) projecting from the undersurface of the center portion of the first sliding block 32. Therefore, by driving the male screw rod 371 in a normal direction or reverse direction with the pulse motor 372, the first sliding block 32 is moved along the guide rails 31 and 31 in the processing-feed direction (X direction) indicated by the arrow X.

The laser beam processing machine in the illustrated embodiment comprises an X-direction position detection means 374 for detecting the processing-feed amount, that is, the X-direction position of the above chuck table 36. The X-direction position detection means 374 comprises a linear scale 374a which is arranged along the guide rail 31 and a read head 374b which is mounted on the first sliding block 32 and moves along the linear scale 374a together with the first sliding block 32. The read head 374b of this X-direction position detection means 374 supplies one pulse signal for every 1 μm to a later-described control means in the illustrated embodiment. The control means which will be described later counts the input pulse signals to detect the processing-feed amount, that is, the X-direction position of the chuck table 36. When the pulse motor 372 is used as a drive source for the above processing-feed means 37, the processing-feed amount, that is, the X-direction position of the chuck table 36 can be detected by counting the drive pulses of the later-described control means for outputting a drive signal to the pulse motor 372. When a servo motor is used as a drive source for the above processing-feed means 37, the processing-feed amount, that is, the X-direction position of the chuck table 36 can be detected by counting the pulse signals outputted from a rotary encoder for detecting the revolution of the servo motor and obtained through the control means later described.

The above second sliding block 33 has, on its undersurface, a pair of to-be-guided grooves 331 and 331 to be fitted to the pair of guide rails 322 and 322 on the top surface of the above first sliding block 32 and is constituted to be able to move in the indexing-feed direction (Y direction) indicated by the arrow Y by fitting the to-be-guided grooves 331 and 331 to the pair of guide rails 322 and 322, respectively. The chuck table mechanism 3 in the illustrated embodiment has a first indexing-feed means 38 for moving the second sliding block 33 in the indexing-feed direction (Y direction) indicated by the arrow Y along the pair of guide rails 322 and 322 mounted on the first sliding block 32. The first indexing-feed means 38 comprises a male screw rod 381 which is arranged between the above pair of guide rails 322 and 322 parallel to them and a drive source such as a pulse motor 382 for rotary-driving the male screw rod 381. The male screw rod 381 is, at its one end, rotatably supported to a bearing block 383 fixed on the top surface of the above first sliding block 32 and is, at the other end, transmission-coupled to the output shaft of the above pulse motor 382. The male screw rod 381 is screwed into a threaded through-hole formed in a female screw block (not shown) projecting from the undersurface of the center portion of the second sliding block 33. Therefore, by driving the male screw rod 381 in a normal direction or reverse direction with the pulse motor 382, the second sliding block 33 is moved along the guide rails 322 and 322 in the indexing-feed direction (Y direction) indicated by the arrow Y.

The laser beam processing machine in the illustrated embodiment comprises a Y-direction position detection means 384 for detecting the indexing-feed amount, that is, the Y-direction position of the above second sliding block 33. The Y-direction position detection means 384 comprises a linear scale 384a which is arranged along the guide rail 322 and a read head 384b which is mounted on the second sliding block 33 and moves along the linear scale 384a together with the second sliding block 33. The read head 384b of this Y-direction position detection means 384 supplies one pulse signal for every 1 μm to the control means (later described) in the illustrated embodiment. The control means which will be described later counts the input pulse signals to detect the indexing-feed amount, that is, the Y-direction position of the chuck table 36. When the pulse motor 382 is used as a drive source for the above first indexing-feed means 38, the indexing-feed amount, that is, the Y-direction position of the chuck table 36 can be detected by counting the drive pulses of the later described control means for outputting a drive signal to the pulse motor 382. When a servo motor is used as a drive source for the above first indexing-feed means 38, the indexing-feed amount, that is, the Y-direction position of the chuck table 36 can be detected by counting the pulse signals outputted from a rotary encoder for detecting the revolution of the servo motor and obtained through the control means later described.

The above laser beam application unit support mechanism 4 has a pair of guide rails 41 and 41 mounted on the stationary base 2 and arranged parallel to each other in the indexing-feed direction (Y direction) indicated by the arrow Y and a movable support base 42 mounted on the guide rails 41 and 41 in such a manner that it can move in the direction indicated by the arrow Y. This movable support base 42 comprises a movable support portion 421 movably mounted on the guide rails 41 and 41 and a mounting portion 422 mounted on the movable support portion 421. The mounting portion 422 is provided with a pair of guide rails 423 and 423 extending in the direction (Z direction) indicated by the arrow Z on one of its flanks. The laser beam application unit support mechanism 4 in the illustrated embodiment has a second indexing-feed means 43 for moving the above movable support base 42 along the pair of guide rails 41 and 41 in the indexing-feed direction (Y direction) indicated by the arrow Y. This second indexing-feed means 43 comprises a male screw rod 431 arranged between the above pair of guide rails 41 and 41 parallel to them and a drive source such as a pulse motor 432 for rotary-driving the male screw rod 431. The male screw rod 431 is, at its one end, rotatably supported to a bearing block (not shown) fixed on the above stationary base 2 and is, at the other end, transmission-coupled to the output shaft of the above pulse motor 432. The male screw rod 431 is screwed into a threaded through-hole formed in a female screw block (not shown) projecting from the undersurface of the center portion of the movable support portion 421 constituting the movable support base 42. Therefore, by driving the male screw rod 431 in a normal direction or reverse direction with the pulse motor 432, the movable support base 42 is moved along the guide rails 41 and 41 in the indexing-feed direction (Y direction) indicated by the arrow Y.

The laser beam application unit 5 in the illustrated embodiment comprises a unit holder 51 and a laser beam application means 52 secured to the unit holder 51. The unit holder 51 has a pair of to-be-guided grooves 511 and 511 to be slidably fitted to the pair of guide rails 423 and 423 arranged on the above mounting portion 422 and is supported in such a manner that it can move in the direction (Z direction) indicated by the arrow Z by fitting the to-be-guided grooves 511 and 511 to the above guide rails 423 and 423, respectively.

The laser beam application unit 5 in the illustrated embodiment has a moving means 53 for moving the unit holder 51 along the pair of guide rails 423 and 423 in the direction (Z direction) indicated by the arrow Z. The moving means 53 comprises a male screw rod (not shown) arranged between the pair of guide rails 423 and 423 and a drive source such as a pulse motor 532 for rotary-driving the male screw rod. By driving the male screw rod (not shown) in a normal direction or reverse direction with the pulse motor 532, the unit holder 51 and the laser beam application means 52 are moved along the guide rails 423 and 423 in the direction (Z direction) indicated by the arrow Z. In the illustrated embodiment, the laser beam application means 52 is moved up by driving the pulse motor 532 in the normal direction and moved down by driving the pulse motor 532 in the reverse direction. The above laser beam application means 52 comprises a cylindrical casing 521 that is secured to the unit holder 51 and extends substantially horizontally. In the casing 521, there is installed a pulse laser beam oscillation means which comprises a pulse laser beam oscillator composed of a YAG laser oscillator or YVO4 laser oscillator and a repetition frequency setting means. This pulse laser beam oscillation means oscillates a pulse laser beam of a wavelength (for example, 355 nm) having absorptivity for the workpiece such as a sapphire substrate in the illustrated embodiment. A condenser 522 having a condenser lens (not shown) therein is mounted on the end of the above casing 521. A laser beam oscillated from the above pulse laser beam oscillation means reaches the condenser 522 through a transmission optical system (not shown) and is applied to the workpiece held on the above chuck table 36 from the condenser 522, with a predetermined focusing spot diameter.

The laser beam processing machine in the illustrated embodiment has an image pick-up means 55 for picking up an image of the area to be processed by the laser beam application means 52, which is mounted onto the front end portion of the casing 521. This image pick-up means 55 comprises an illuminating means for illuminating the workpiece, an optical system for capturing the area illuminated by the illuminating means, and an image pick-up device (CCD) for picking up an image captured by the optical system. An image signal is supplied to the control means that will be described later.

The laser beam processing machine in the illustrated embodiment comprises a device 6 for detecting the edges of the workpiece held on the chuck table 36.

Figure 2:
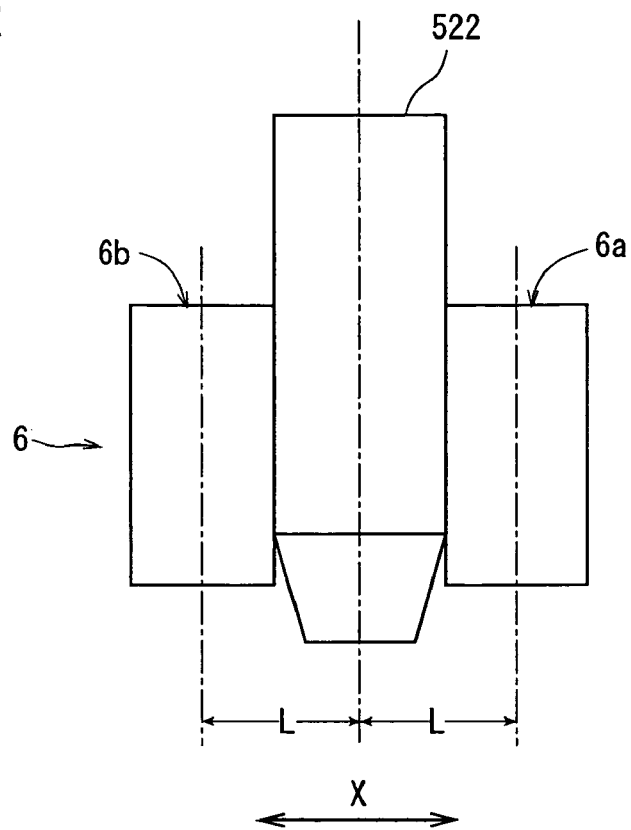
FIG. 2 is a front view of the device for detecting the edges of a workpiece constituted according to the present invention provided in the laser beam processing machine shown in FIG. 1.

The device 6 for detecting the edges of the workpiece shown in FIG. 1 is composed of a first edge detector 6a and a second edge detector 6b all of which are attached to the condenser 522 of the laser beam application means 52. The first edge detector 6a and the second edge detector 6b are arranged on both sides in the processing-feed direction X of the condenser 522 with a predetermined distance L between the center of the condenser 522 and the center thereof as shown in FIG. 2, respectively. The first edge detector 6a and the second edge detector 6b may have the same constitution, and a first embodiment of the present invention will be described with reference to FIG. 3.

Figure 3:
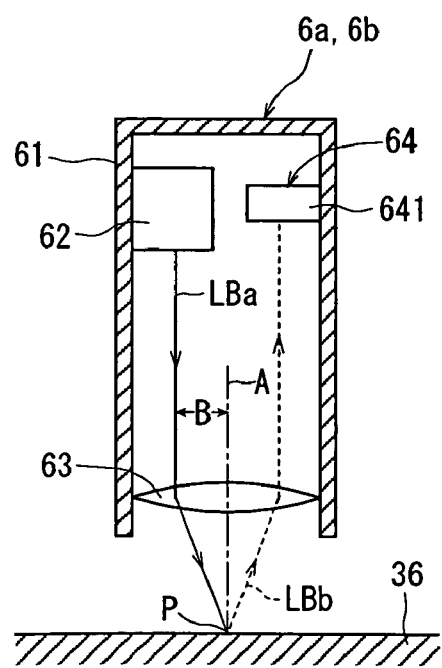
FIG. 3 is a sectional view of a first embodiment of the device for detecting the edges of a workpiece constituted according to the present invention.

Each of the first edge detector 6a and the second edge detector 6b shown in FIG. 3 comprises a cylindrical case 61, a beam oscillation means 62 for oscillating a detection beam, installed in the case 61, an objective lens 63 for focusing the detection beam oscillated from the beam oscillation means 62, and a reflected light detection means 64 for detecting the reflected light of the detection beam applied through the objective lens 63. The beam oscillation means 62 is composed of a laser diode in the illustrated embodiment and controlled by the control means that will be described later. The beam oscillation means 62 composed of a laser diode oscillates the detection beam LBa having, for example, an output of 10 mW and a diameter of 1.0 mm toward a position offset from the center axis A of the objective lens 63 by a predetermined distance B in such a manner that the optical axis of the detection beam LBa becomes parallel to the center axis A. The objective lens 63 focuses the detection beam LBa oscillated from the beam oscillation means 62 and applies it to the holding surface which is the top surface of the above chuck table 36. The reflected light detection means 64 receives the reflected light LBb of the detection beam LBa applied through the objective lens 63 and reflected on the workpiece held on the chuck table 36. This reflected light detection means 64 comprises a position detector 641 such as a position-sensitive detector (PSD) or CCD line sensor in the illustrated embodiment, and its detection signal is supplied to the control means later described.

The first edge detector 6a and the second edge detector 6b shown in FIG. 3 are constituted as described above, and their function will be described with reference to FIGS. 4(a) and 4(b).

Figure 4:
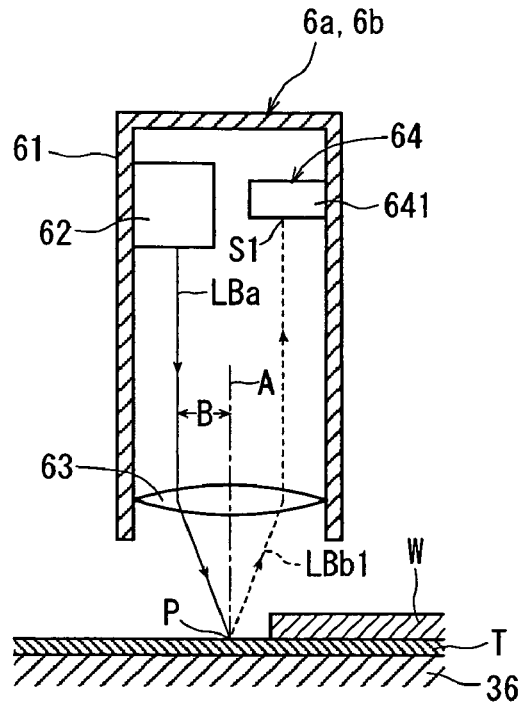
FIGS. 4(a) and 4(b) are explanatory diagrams showing the detection state of the device for detecting the edges of a workpiece shown in FIG. 3.
Figure 4:
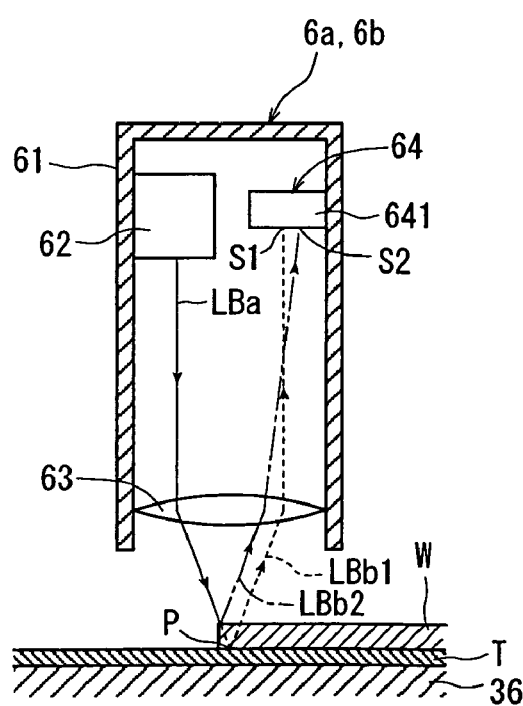

When the detection beam LBa oscillated from the beam oscillation means 62 is focused and refracted by the objective lens 63 and applied to the dicing tape T having the workpiece W on the front surface and held on the chuck table 36, as shown in FIG. 4(a), it is reflected on the front surface of the dicing tape T and then, its reflected light LBb1 goes toward the objective lens 63. When the focal point P of the detection beam LBa focused and refracted by the objective lens 63 is adjusted to be aligned with the front surface of the dicing tape T at this point as shown in FIG. 4(a), the focal point P is brought to a position on the center axis A of the objective lens 63. The focal point P of the detection beam LBa thus focused and refracted by the objective lens 63 has a spot diameter of several μm. The reflected light LBb1 reflected on the front surface of the dicing tape T at the focal point P reaches the objective lens 63 to be refracted by the objective lens 63, goes parallel to the center axis A of the objective lens 63 and reaches the first position S1 of the position detector 641. The position detector 641 supplies a first position signal S1 indicative of the reception of the reflected light LBb1 to the control means that will be described later.

A description is subsequently given of a case where the detection beam LBa oscillated from the beam oscillation means 62 and focused and refracted by the objective lens 63 is applied to the top surface of the workpiece W put on the front surface of the dicing tape T held on the chuck table 36, as shown in FIG. 4(b). In this case, since the detection beam LBa focused and refracted by the objective lens 63 is reflected on the top surface of the workpiece W on the upstream side of the focal point P, the reflected light LBb2 of the detection beam LBa reaches a position closer to the center axis A of the objective lens than the reflected light LBb1 reflected at the focal point P. The reflected light LBb2 reaching a position closer to the center axis A of the objective lens 63 than the reflected light LBb1 reflected at the focal point P is refracted at a refractive index smaller than the refractive index of the reflected light LBb1. As a result, the second position S2 of the reflected light LBb2 reaching the position detector 641 differs in position from the first position S1 of the above reflected light LBb1. The position detector 641 which thus has received the reflected light LBb2 at the second position S2 supplies a second position signal S2 indicative of the reception of the reflected light LBb2 to the control means described later. The later-described control means which has received the position signal from the position detector 641 judges that when it has received the first position signal S1, the detection beam has reached an area where the workpiece W is not existent and that when it has received the second position signal S2, the detection beam has reached the edge portion of the workpiece W.

Figure 5:
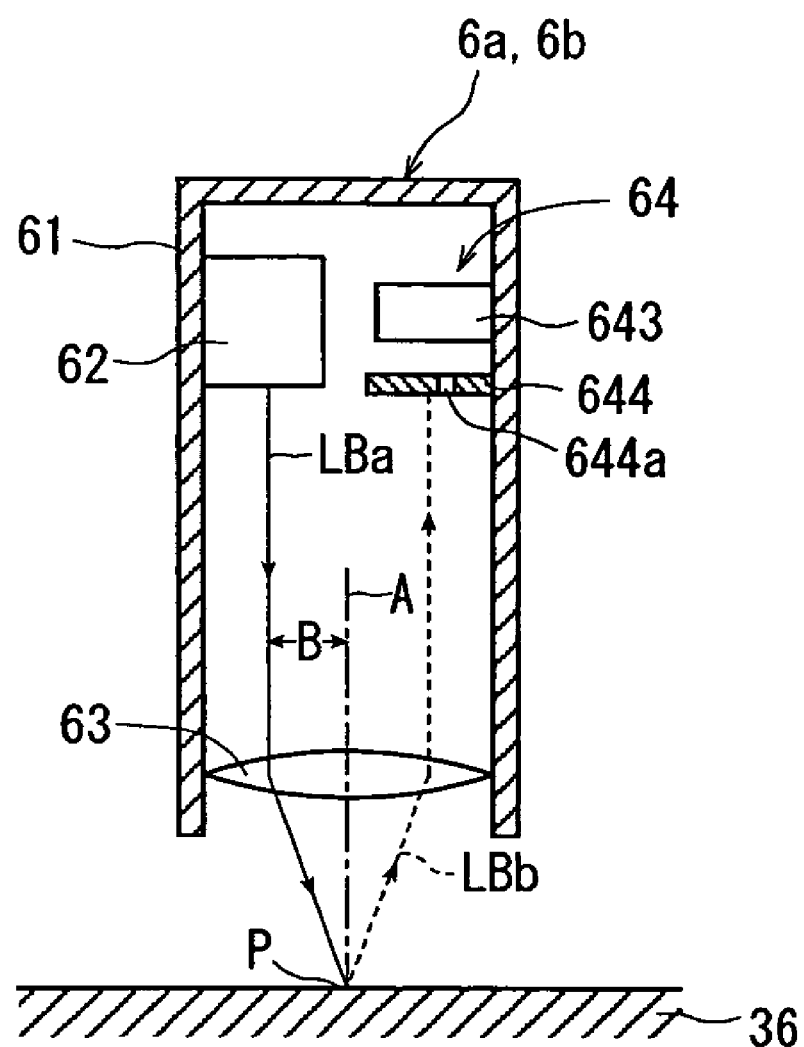
FIG. 5 is a sectional view of a second embodiment of the device for detecting the edges of a workpiece constituted according to the present invention.

Then, the first edge detector 6a and the second edge detector 6b according to a second embodiment of the present invention will be described with reference to FIG. 5. The first edge detector 6a and the second edge detector 6b shown in FIG. 5 are substantially the same except for the reflected light detection means 64. Since the other members are substantially the same, the same members are given the same reference symbols and their descriptions are omitted.

The reflected light detection means 64 in the first edge detector 6a and the second edge detector 6b shown in FIG. 5 comprises a photosensor 643 for receiving the reflected light LBb of the detection beam LBa applied through the objective lens 63 and a mask member 644 which is arranged between the photosensor 643 and the objective lens 63 and has a pin hole 644a. This mask member 644 is constituted to block off the reflected light LBb of the detection beam LBa which is oscillated from the oscillation means 62, focused by the objective lens 63, reflected on the dicing tape T held on the chuck table 36 and refracted by the objective lens 63. Therefore, the mask member 644 has the function of blocking off the reflected light reflected on the area where the workpiece is not existent and refracted by the objective lens. And, the pin hole 644a of the mask member 644 is so constituted as to let pass therethrough the reflected light LBb of the detection beam LBa which is oscillated from the beam oscillation means 62, focused by the objective lens 63, reflected on the workpiece W held on the chuck table 36 and refracted by the objective lens 63 as will be described later. The reflected light LBb thus passing through the pin hole 644a of the mask member 644 is received by the photosensor 643.

The first edge detector 6a and the second edge detector 6b shown in FIG. 5 are constituted as described above, and their function will be described with reference to FIGS. 6(a) and 6(b).

Figure 6:
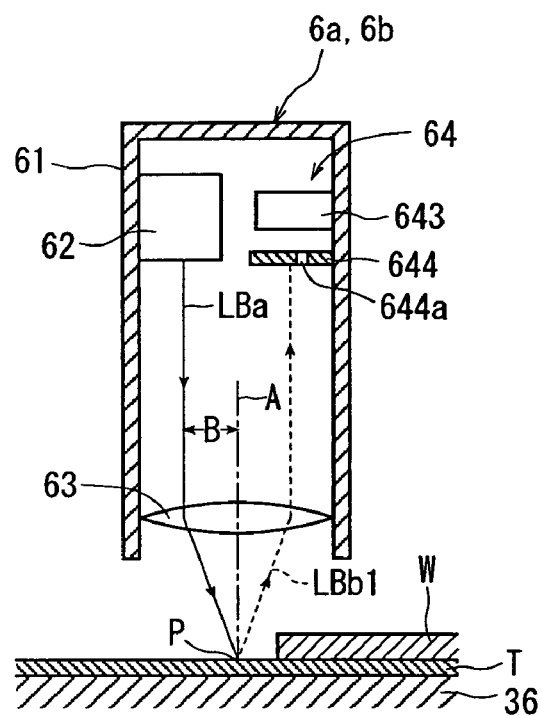
FIGS. 6(a) and 6(b) are explanatory diagrams showing the detection state of the device for detecting the edges of a workpiece shown in FIG. 5.
Figure 6:
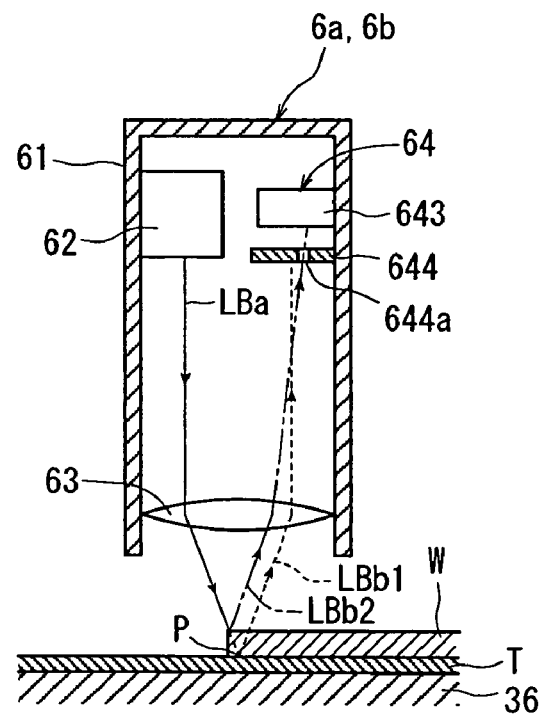

When the detection beam LBa oscillated from the beam oscillation means 62 is focused and refracted by the objective lens 63 like the embodiment shown in FIG. 3 and FIGS. 4(a) and 4(b) and applied to the dicing tape T having the workpiece W put on the front surface and held on the chuck table 36 as shown in FIG. 6(a), it is reflected on the front surface of the dicing tape T and its reflected light LBb1 goes toward the objective lens 63. When the focal point P of the detection beam LBa focused and refracted by the objective lens 63 is adjusted to be aligned with the front surface of the dicing tape T at this point as shown in FIG. 6(a), the focal point P is brought to a position on the center axis A of the objective lens 63. The reflected light LBb1 reflected on the front surface of the dicing tape T at the focal point P reaches the objective lens 63 to be refracted by the objective lens 63 and goes parallel to the center axis A of the objective lens 63. This reflected light LBb1 is blocked off by the mask member 644 arranged between the objective lens 63 and the photosensor 643 and does not reach the photosensor 643.

A description is subsequently given of a case where the detection beam LBa oscillated from the beam oscillation means 62 and focused and refracted by the objective lens 63 is applied to the top surface of the workpiece W put on the front surface of the dicing tape T held on the chuck table 36, as shown in FIG. 6(b). In this case, since the detection beam LBa focused and refracted by the objective lens 63 is reflected on the top surface of the workpiece W on the upstream side of the focal point P, its reflected light LBb2 reaches a position closer to the center axis A of the objective lens 63 than the reflected light LBb1 reflected at the focal point P like the embodiment shown in FIG. 3 and FIGS. 4(a) and 4(b). The reflected light LBb2 which has reached a position closer to the center axis A of the objective lens 63 than the reflected light LBb1 reflected at the focal point P is refracted at a refractive index smaller than the refractive index of the reflected light LBb1. The reflected light LBb2 thus refracted by the objective lens 63 passes through the pin hole 644a formed in the mask member 644 and is received by the photosensor 643. When the photosensor 643 receives the reflected light LBb2 passing through the pin hole 644a, it supplies a reception signal to the control means later described. Therefore, this later-described control means judges that when it does not have received any reception signal from the photosensor 643, the detection beam LBa has reached the area where the workpiece W is not existent and that when it has received a reception signal from the photosensor 643, the detection beam LBa has reached the edge portion of the workpiece W.

Each of the first edge detector 6a and the second edge detector 6b has the following constitution. That is, they comprise the reflected light detection means 64 for detecting the reflected light LBb1 and reflected light LBb2 of the detection beam LBa oscillated from the beam oscillation means 62 which oscillates the detection beam LBa toward a position offset from the center axis A of the objective lens 63 by a predetermined distance B in such a manner that the optical axis of the detection beam LBa becomes parallel to the center axis A and applied through the objective lens 63. The reflected light detection means 64 detects the edge of the workpiece based on a positional difference between reflected light which is reflected on the area where the workpiece is not existent and refracted by the objection lens 63 and reflected light which is reflected on the workpiece and refracted by the objective lens 63. Therefore, the whole configuration of the device can has a compact constitution as compared with a constitution which oscillates a detection beam at an angle. In addition, since the detection beam LBa oscillated from the above beam oscillation means 62 is refracted by the objective lens 63 and applied to the top surface of the workpiece W at an angle, even when the workpiece is a transparent member, specular reflection light can be captured.

Returning to FIG. 1, the laser beam processing machine in the illustrated embodiment comprises the control means 7. The control means 7 is composed of a computer which comprises a central processing unit (CPU) 71 for carrying out arithmetic processing based on a control program, a read-only memory (ROM) 72 for storing the control program, etc., a read/write random access memory (RAM) 73 for storing the results of operations, a counter 74, an input interface 75 and an output interface 76. Detection signals from the above X-direction position detection means 374, the Y-direction position detection means 384, the image pick-up means 55 and the position detectors 641 or photosensors 643 of the first edge detector 6a and the second edge detector 6b are inputted to the input interface 75 of the control means 7. Control signals are supplied to the above pulse motor 360, the pulse motor 372, the pulse motor 382, the pulse motor 432, the pulse motor 532, the pulse laser beam application means 52, the beam oscillation means 62 of the first edge detector 6a and the second edge detector 6b and a display means 70, etc., from the output interface 76 of the control means 7.

The laser beam processing machine in the illustrated embodiment is constituted as described above, and its function will be described hereinbelow.

Figure 7:
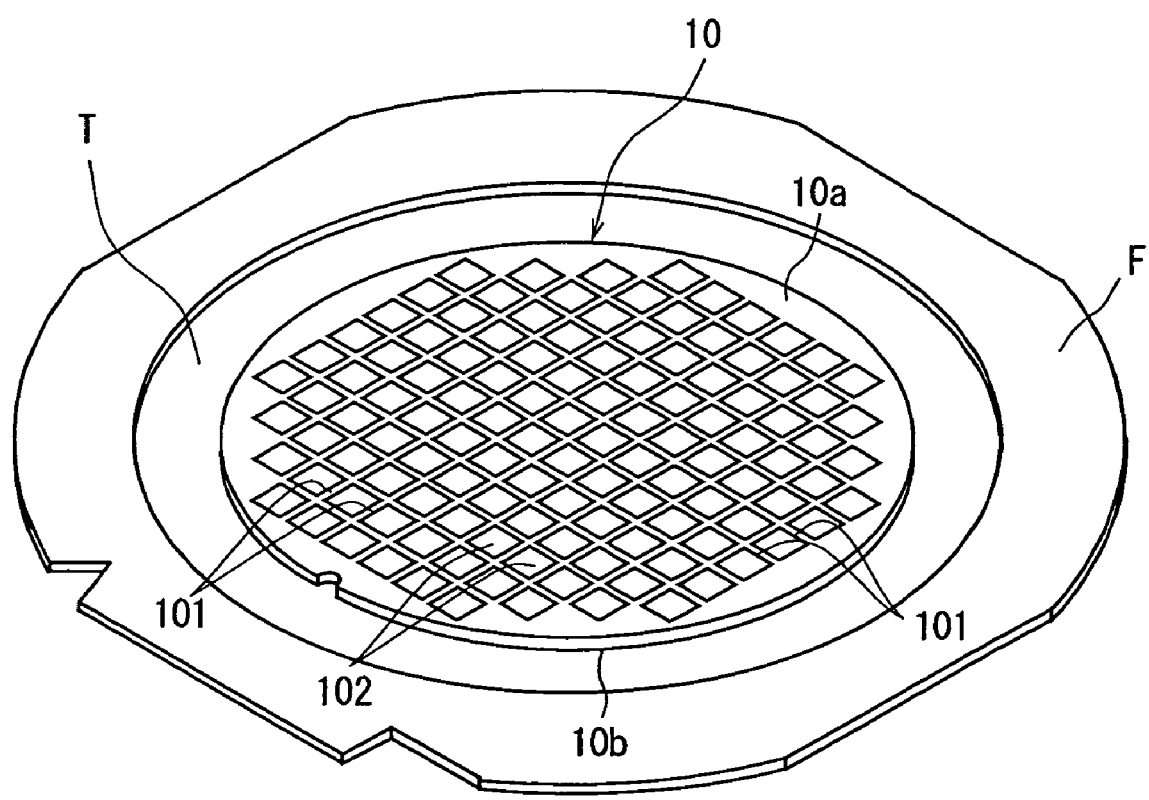
FIG. 7 is a perspective view showing a state where an optical device wafer as a workpiece is put on the front surface of a dicing tape mounted on an annular frame.

FIG. 7 shows a state where an optical device wafer 10 as the workpiece is put on the front surface of the dicing tape T mounted on the annular frame F. The optical device wafer 10 is composed of a sapphire wafer, a plurality of areas are sectioned by a plurality of streets 101 formed in a lattice pattern on the front surface 10a, and an optical device 102 such as a light emitting diode or the like is formed in each of the sectioned areas.

To carry out laser processing along the streets 101 of the above optical device wafer 10, the dicing tape T side of the optical device wafer 10 is first placed on the chuck table 36 of the above-described laser beam processing machine shown in FIG. 1 so that the front surface 10a faces up, and the optical device wafer 10 is suction-held via the dicing tape T. Further, the annular frame F having the dicing tape T mounted thereon is fixed by the clamps 362 provided on the chuck table 36.

The chuck table 36 suction-holding the optical device wafer 10 as described above is brought to a position right below the image pick-up means 55 by activating the processing-feed means 37. After the chuck table 36 is positioned right below the image pick-up means 55, alignment work for detecting the area to be processed of the optical device wafer 10 is carried out by the image pick-up means 55 and the control means 7. That is, the image pick-up means 55 and the control means 7 carry out image processing such as pattern matching, etc. to align a street 101 formed in a predetermined direction of the optical device wafer 10 with the above condenser 522, thereby performing the alignment of a laser beam application position. Further, the alignment of the laser beam application position is also similarly carried out on streets 101 formed on the optical device wafer 10 in a direction perpendicular to the above predetermined direction.

Figure 8:
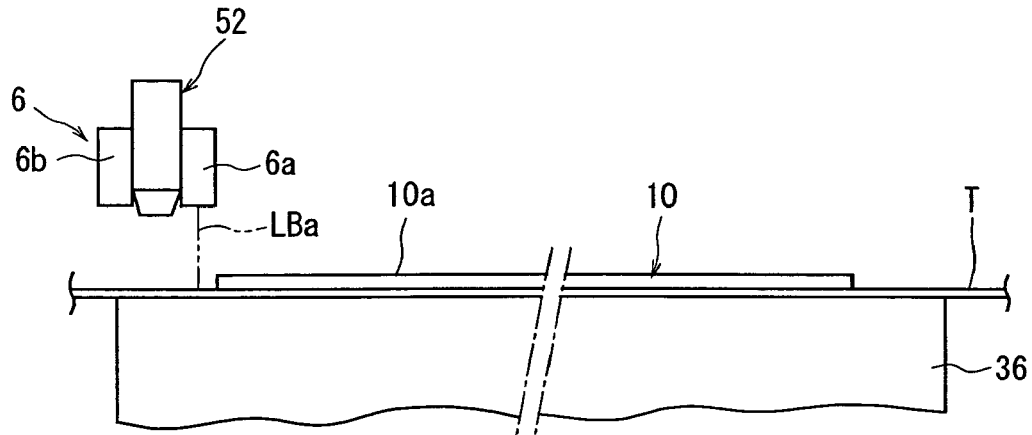
FIGS. 8(a), 8(b) and 8(c) are explanatory diagrams showing a laser processing step which is carried out by the laser beam processing machine shown in FIG. 1.
Figure 8:
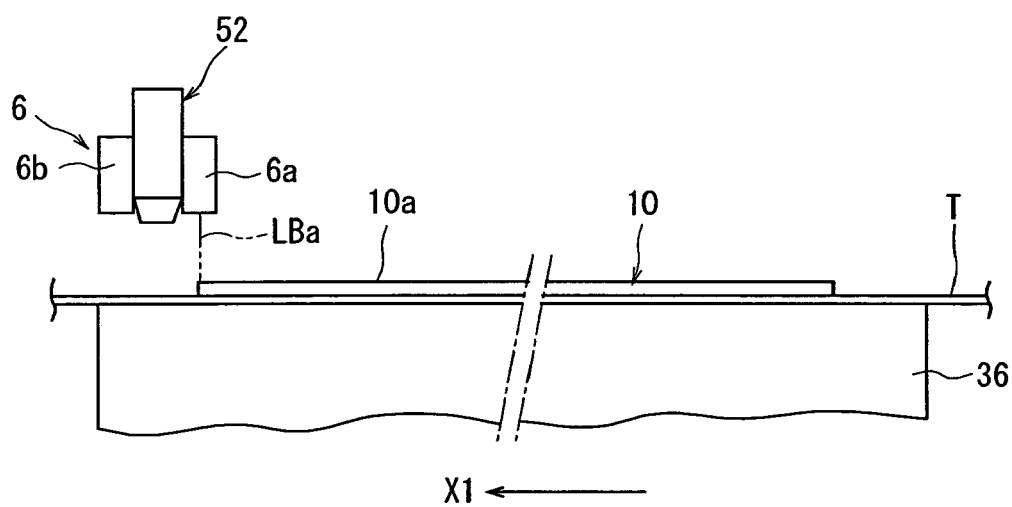
Figure 8:
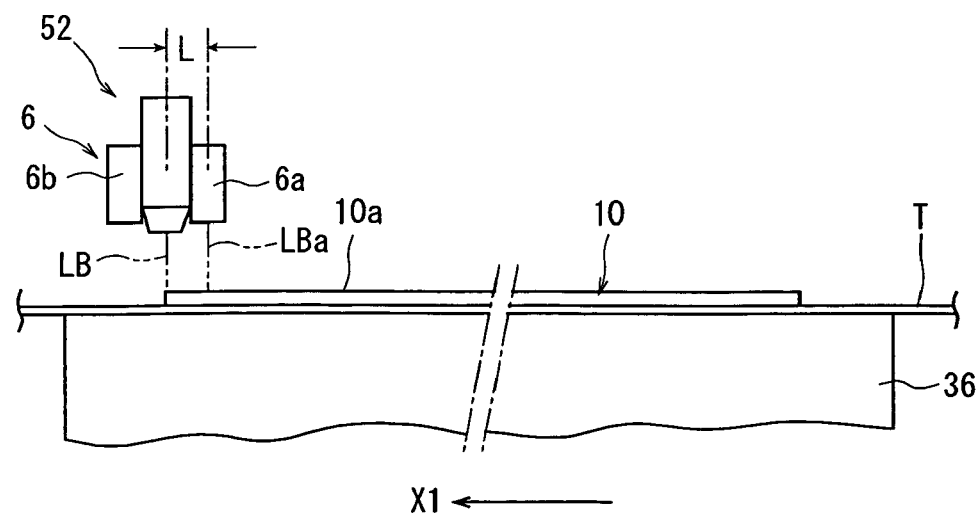

After the street 101 formed on the optical device wafer 10 held on the chuck table 36 is detected and the alignment of the laser beam application position is carried out as described above, the processing-feed means 37 and the first indexing-feed means 38 are activated to move the chuck table 36 to a laser beam application area where the condenser 522 and the edge detection device 6 are located, so that the predetermined street 101 formed on the optical device wafer 10 is aligned with the condenser 522 and the edge detection device 6, as shown in FIG. 8(a). At this point, the left end in FIG. 8(a) of the optical device wafer 10 is so positioned as to be on the right sides of the condenser 522 and the edge detection device 6. Then, the first edge detector 6a of the edge detection device 6 is activated and the processing-feed means 37 is also activated to move the chuck table 36 in the processing-feed direction shown by an arrow X1 in FIG. 8(a) at a predetermined processing-feed rate. At this point, in the case of the first edge detector 6a being the edge detector shown in FIG. 3, when the detection beam LBa oscillated from the beam oscillation means 62 and focused and refracted by the objective lens 63 is applied to the dicing tape T as shown in FIG. 8(a), the reflected light LBb1 reaches the first position S1 of the position detector 641 like the embodiment shown in FIG. 4(a), and the position detector 641 supplies the first position signal S1 indicative of the reception of the reflected light LBb1 to the control means 7. Meanwhile, in the case where the first edge detector 6a is the edge detector shown in FIG. 5, when the detection beam LBa oscillated from the beam oscillation means 62 and focused and refracted by the objective lens 63 is applied to the dicing tape T as shown in FIG. 8(a), the reflected light LBb1 is blocked off by the mask member 644 like the embodiment shown in FIG. 6(a).

Thereafter, when the chuck table 36 moves in the processing-feed direction indicated by the arrow X1 from the state shown in FIG. 8(a) and the detection beam LBa oscillated from the beam oscillation means 62 and focused and refracted by the objective lens 63 is applied to the left end (edge) of the optical device wafer 10 as shown in FIG. 8(b), the reflected light LBb2 reflected on the top surface of the optical device wafer 10 reaches the second position S2 of the position detector 641 like the embodiment shown in FIG. 4(b) in the case where the first edge detector 6a is the edge detector shown in FIG. 3, and the position detector 641 supplies the second position signal S2 indicative of the reception of the reflected light LBb2 to the control means 7. The control means 7 which has received this second position signal S2 judges that the left end (edge) of the optical device wafer 10 has reached a position right below the first edge detector 6a. Meanwhile, when the first edge detector 6a is the edge detector shown in FIG. 5 and the detection beam LBa oscillated from the beam oscillation means 62 and focused and refracted by the objective lens 63 is applied to the left end (edge) of the optical device wafer 10 as shown in FIG. 8(b), the reflected light LBb2 reflected on the top surface of the optical device wafer 10 passes through the pin hole 644 formed in the mask member 644 and is received by the photosensor 643 like the embodiment shown in FIG. 6(b). The photosensor 643 which has thus received the reflected light LBb2 passing through the pin hole 644a formed in the mask member 644 supplies a reception signal to the control means 7. The control means 7 which has received the reception signal from the photosensor 643 judges that the left end (edge) of the optical device wafer 10 has reached a position right below the first edge detector 6a.

Figure 9:
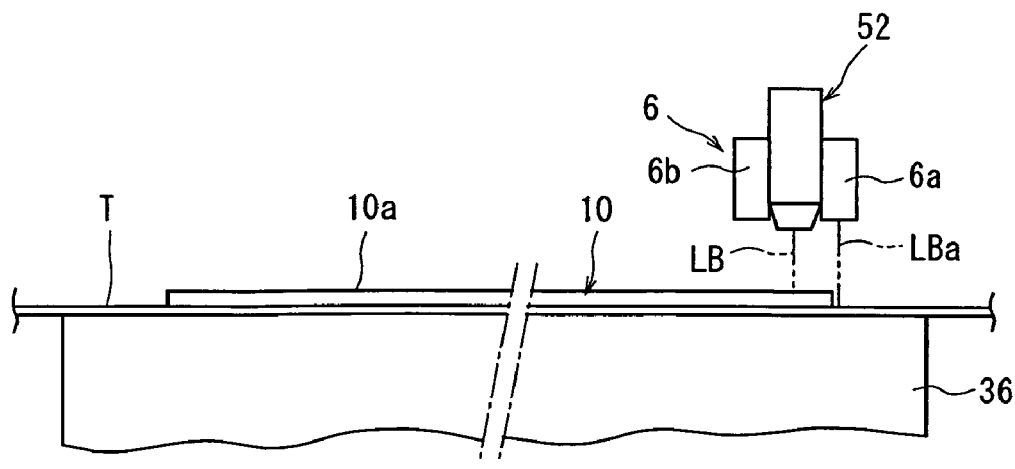
FIGS. 9(a), 9(b) and 9(c) are explanatory diagrams showing the laser processing step which is carried out by the laser beam processing machine shown in FIG. 1.
Figure 9:
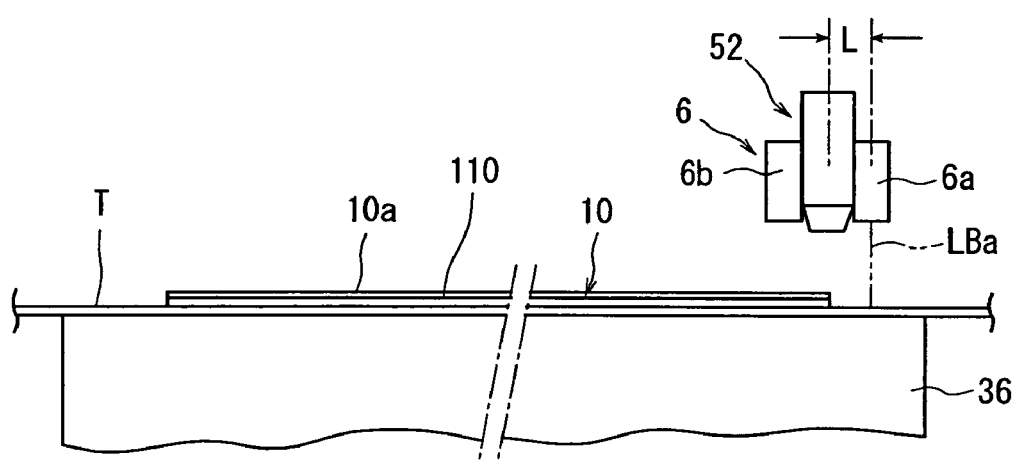
Figure 9:
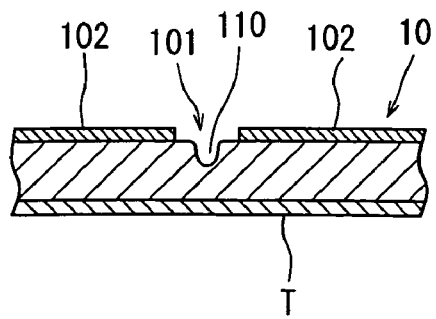

After the control means 7 judges that the left end (edge) of the optical device wafer 10 has reached a position right below the first edge detector 6a as shown in FIG. 8(b), it obtains the moving distance in the direction indicated by the arrow X1 of the chuck table 36 based on a detection signal from the X-direction position detection means 374. And, when this moving distance reaches the distance L between the center of the first edge detector 6a and the center of the condenser 522 as shown in FIG. 8(c), the control means 7 judges that the left end (edge) of the optical device wafer 10 has reached a position right below the condenser 522, and activates the laser beam application means 52 to apply a pulse laser beam from the condenser 522 (laser beam application step). As a result, a pulse laser beam is applied along the street 101 from the left end (edge) of the optical device wafer 10. When the chuck table 36 is moved in the processing-feed direction indicated by the arrow X1 in FIG. 8(c) while the pulse laser beam is applied from the condenser 522, the right end (edge) of the optical device wafer 10 passes over a position right below the first edge detector 6a as shown in FIG. 9(a) and the detection beam LBa applied from the first edge detector 6a reaches the dicing tape T, the control means 7 judges that the optical device wafer 10 is not existent right below the first edge detector 6a and obtains the moving distance in the direction indicated by the arrow X1 of the chuck table 36 based on a detection signal from the X-direction position detection means 374 as described above. When this moving distance reaches the distance L between the center of the first edge detector 6a and the center of the condenser 522 as shown in FIG. 9(b), the control means 7 judges that the right end (edge) of the optical device wafer 10 has reached a position right below the condenser 522, suspends the application of the pulse laser beam from the condenser 522 and stops the movement of the chuck table 36. As a result, a groove 110 is formed between the both ends of the street 101 in the optical device wafer 10 as shown in FIGS. 9(b) and 9(c).

The processing conditions in the above laser beam application step are set as follows, for example.

Figure 10:
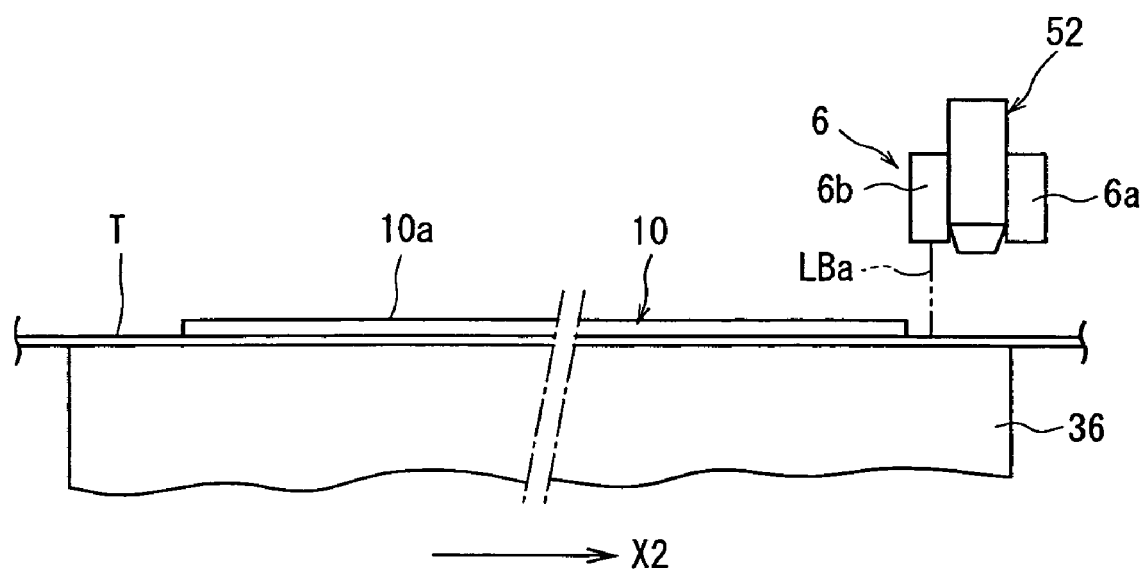
FIG. 10 is an explanatory diagram showing the laser processing step which is carried out by the laser beam processing machine shown in FIG. 1.

Light source: LD excited Q switch Nd:YVO4 laser
Wavelength: 355 nm
Repetition frequency: 70 kHz
Average output: 1.0 W
Focusing spot diameter: 10 μm
Processing feed rate: 70 mm/sec After the laser beam application step is carried out along the predetermined street 101 formed on the optical device wafer 10 as described above, the first indexing-feed means 38 is activated to move the chuck table 51 a distance corresponding to the interval between streets 101 in the indexing-feed direction and the processing-feed means 37 is also activated to bring the right end of the optical device wafer 10 to a position on the left sides of the condenser 522 and the edge detection device 6, as shown in FIG. 10. Then, the second edge detector 6b is activated and the processing-feed means 37 is activated to move the chuck table 36 in the processing-feed direction indicated by an arrow X2 in FIG. 10 at a predetermined processing-feed rate to carry out the above laser beam application step. Since the first edge detector 6a and the second edge detector 6b are arranged on both sides in the processing-feed direction X of the condenser 522, respectively, with the center-to-center distance L, in the illustrated embodiment, the first edge detector 6a or the second edge detector 6b is activated according to the forward or backward movement of the chuck table 36 so that the laser beam application step can be carried out during the forward movement and backward movement of the chuck table 36.

After the above laser beam application step is carried out along all the streets 101 extending in the predetermined direction of the optical device wafer 10, the chuck table 36 is turned at 90° to carry out the above laser beam application step along streets 101 extending in a direction perpendicular to the above predetermined direction.

What is claimed is:

1. A device for detecting the edges of a workpiece held horizontally on a chuck table of a processing machine, said device comprising:
    a beam oscillation means for oscillating a detection beam,
    an objective lens for focusing the detection beam oscillated from the beam oscillation means, and
    a reflected light detection means for detecting the reflected light of the detection beam applied through the objective lens, wherein
    the beam oscillation means oscillates the detection beam in such a manner that the optical axis of the detection beam becomes parallel to a center axis of the objective lens at a position offset from the center axis by a predetermined distance;
    the reflected light detection means detects the edge of the workpiece based on a horizontal positional difference between reflected light obtained when the detection beam oscillated from the beam oscillation means and applied through the objective lens is reflected on an area where the workpiece is not existent and refracted by the objective lens and reflected light obtained when the detection beam is reflected on the workpiece and refracted by the objective lens; and
    the reflected light detection means includes a line sensor as a position detector for receiving reflected light which is reflected on the area where the workpiece is not existent and refracted by the objective lens and reflected light which is reflected on the workpiece and refracted by the objective lens, wherein
    the edge portion of the workplace is detected by horizontal displacement of the position where the reflected light is received on the line sensor, and
    the beam oscillation means and the reflected light detecting means are arranged immediately above the area where the lens is placed, along axes parallel to the center of the objective lens.

2. The reflective light detection according to claim 1, wherein the line detector supplies a detection signal.

3. A laser beam processing machine comprising:
    a chuck table for horizontally holding a workpiece,
    a laser beam application means comprising a condenser for applying a laser beam to the workpiece held on the chuck table,
    a processing-feed means for moving the chuck table and the laser beam application means relative to each other, and
    a device for detecting the edges of the workpiece, the device for detecting the edges being arranged adjacent to the condenser in the processing-feed direction and having a beam oscillation means for oscillating a detection beam, an objective leans for focusing the detection beam oscillated from the beam oscillation means, and a reflected light detection means for detecting the reflected light of the detection beam applied through the objective lens, wherein
    the beam oscillation means oscillates the detection beam in such a manner that the optical axis of the detection beam becomes parallel to the center axis of the objective lens at the position offset from the center axis by a predetermined distance; and
    the reflected light detection means detects the edge of the workpiece based on a horizontal positional difference between reflected light obtained when the detection beam oscillated from the beam oscillation means and applied through the objective lens is reflected on an area where the workpiece is not existent and refracted by the objective lens and reflected light obtained when the detection beam is reflected on the workpiece and refracted by the objective lens,
    the reflected light detection means includes a line sensor as a position detector,
    the edge portion of the workplace is detected by horizontal displacement of the position where the reflected light is received on the line sensor, and
    the beam oscillation means and the reflected light detecting means are arranged immediately above the area where the lens is placed, along axes parallel to the center of the objective lens.

4. The laser beam processing machine according to claim 3, wherein the device for detecting the edges of the workpiece is arranged on both sides in the processing-feed direction of the condenser.

* * * * *